United States Patent [19]

Coppens et al.

[11] Patent Number: 6,010,818
[45] Date of Patent: Jan. 4, 2000

[54] METHOD FOR MAKING AN OFFSET PRINTING PLATE ACCORDING TO THE SILVER SALT DIFFUSION TRANSFER PROCESS

[75] Inventors: Paul Coppens, Turnhout; Ludo Vervloet, Kessel, both of Belgium

[73] Assignee: AGFA-Gevaert, N.V., Mortsel, Belgium

[21] Appl. No.: 09/081,572

[22] Filed: May 19, 1998

Related U.S. Application Data

[60] Provisional application No. 60/053,184, Jul. 17, 1997.

[30] Foreign Application Priority Data

Jun. 5, 1997 [EP] European Pat. Off. ............ 97201684

[51] Int. Cl.$^7$ ................. G03F 7/07; G03C 8/06; G03C 8/28
[52] U.S. Cl. ........................... 430/204; 430/248
[58] Field of Search ..................... 430/204, 248

[56] References Cited

U.S. PATENT DOCUMENTS

| | | | |
|---|---|---|---|
| 5,196,290 | 3/1993 | Coppens et al. | 430/204 |
| 5,200,294 | 4/1993 | De Keyzer et al. | 430/204 |
| 5,445,914 | 8/1995 | Coppens et al. | 430/204 |
| 5,518,866 | 5/1996 | Coppens et al. | 430/204 |
| 5,635,330 | 6/1997 | Coppens et al. | 430/204 |
| 5,677,105 | 10/1997 | Van Rompuy et al. | 430/204 |
| 5,712,076 | 1/1998 | Coppens et al. | 430/204 |
| 5,853,950 | 12/1998 | Kondo et al. | 430/204 |
| 5,910,391 | 6/1999 | Kondo et al. | 430/204 |

*Primary Examiner*—Richard L. Schilling
*Attorney, Agent, or Firm*—Breiner & Breiner

[57] ABSTRACT

The present invention provides a method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer, applying an aqueous alkaline solution to the imaging element in the presence of (a) developing agent(s) and (a) silver halide solvent(s) to form a silver image in said image receiving layer, treating the imaging element with a first lithographic finisher in order to remove the layer(s) on top of the image receiving layer, thereby exposing the imaged surface of the support by uncovering said silver image formed in said image receiving layer, treating said exposed imaged surface of the support with a second lithographic finisher to enhance the water-receptivity of the non-image areas and to make the image areas oleophilic ink-receptive, wherein both lithographic finishers include a hydrophobizing agent, a surface-active agent and a hydrophilic film-forming compound.

12 Claims, No Drawings

METHOD FOR MAKING AN OFFSET PRINTING PLATE ACCORDING TO THE SILVER SALT DIFFUSION TRANSFER PROCESS

The application claim benefit of U.S. provisional application No. 60/053,184 filed Jul. 17, 1997.

DESCRIPTION

1. Field of the Invention

The present invention relates to an improved method for making improved lithographic printing plates according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by Andre Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left which is used as a printing plate. Such type of lithographic printing plate is disclosed e.g. in U.S. Pat. No. 3,511,656.

As for other printing plates it is required that the offset printing plates belonging to the second type of mono-sheet DTR offset printing plates have good printing properties: a high printing endurance, good ink acceptance in the printing areas, no ink acceptance in the non-printing areas (no toning) and a low number of copies that have to be disposed off because of ink acceptance in the non-printing areas (so called staining) during start-up of the printing process. Furthermore these printing properties should be preserved even after storing the printing plates for some time.

In order to improve the printing properties, it is common practice in the art to subject the imaged surface of the support to a chemical treatment that increases the hydrophilicity of the non-silver image parts and the oleophilicity of the silver image. This chemical after-treatment is preferably carried out with an aqueous lithographic composition often called lithographic finisher, which comprises at least one compound enhancing the ink-receptivity and/or lacquer-receptivity of the silver image, and also comprises at least one compound that improves the ink-repelling characteristics of the hydrophilic supports. Actually U.S. Pat. No. 4,062,682 discloses a lithographic finisher containing 5 g/l of a imidazoline-2-thione, 50 ml of oleic acid and 50 ml ethylene glycol monomethyl ether, U.S. Pat. No. 4,563,410 discloses a lithographic finisher containing 1 g/l of a mercaptotriazole and 5 g/l of polyethylene oxide with a molecular weight of 4,000, U.S. Pat. No. 5,068,165 discloses a lithographic finisher containing 2 g/l of a mercaptotetrazole, 2.5 g/l of n-hexadecyl trimethyl ammonium chloride and 20 g/l of polystyrene sulphonic acid and EP-A 278,766 discloses a lithographic finisher containing 2 g/l of a mercaptotetrazole and 100 ml of polyethylene oxide with a molecular weight of 200. EP-A 681,219 discloses a very efficient lithographic finisher comprising (a) hydrophobizing agent(s) in a total concentration between 0.1 g/l and 10 g/l, (a) surface-active compound(s) and (a) polyglycol(s) comprising at least 50% by weight ethyleneoxide groups and/or propyleneoxide groups whose total sum is at least 12 and being present in said lithographic finisher in a total amount of at least 20 g/l.

However, the method to process said plates and the plates itself could use some improvement. First of all the removal of the emulsion layer is carried out by washing with water. This requires a connection between the plumbing system and the processing equipment. Furthermore in the washing zone there arises during processing a substantial height of foam, what sometimes lead to an overflow of washing water in said zone. The processed plates show an upstart phenomenon: i.e. the first processed plates have a bronzed outlook and spot blinding. Still further the processed plates do not have a clean outlook.

SUMMARY OF THE INVENTION

It is an object of the present invention to provide a method for preparing a high quality lithographic plate with improved properties according to the DTR-process using an imaging element having a support with a hydrophilic surface and using a processor requiring no connection to the plumbing.

It is a further object of the present invention to provide a method for preparing a high quality lithographic plate with improved properties according to the DTR-process using an imaging element having a support with a hydrophilic surface, causing less foam in the rinsing zone.

It is still a further object of the present invention to provide a method for preparing a high quality lithographic plate according to the DTR-process using an imaging element having a support with a hydrophilic surface, having no upstart phenomenom.

It is still a further object of the present invention to provide a method for preparing a high quality lithographic plate according to the DTR-process using an imaging element having a support with a hydrophilic surface, having a very clean outlook.

Further objects of the present invention will become clear from the description hereinafter.

According to the present invention there is provided a method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer, applying an aqueous alkaline solution to the imaging element in the presence of (a) developing agent(s) and (a) silver halide solvent(s) to form a silver image in said image receiving layer, treating in a washing step the imaging element with a first lithographic finisher in order to remove the layer(s) on top of the image receiving layer, thereby exposing the imaged surface of the support by uncovering said silver image formed in said image receiving layer, treating in a finishing step said exposed imaged surface of the support with a second lithographic finisher to enhance the water-receptivity of the non-image areas and to make the image areas oleophilic ink-receptive, characterized in that both lithographic finishers include a hydrophobizing agent, a surface-active agent and a hydrophilic film-forming compound.

DETAILED DESCRIPTION OF THE INVENTION

Lithographic printing plates having improved properties are obtained in an improved way according to the DTR-process by removing the layers on top of the image receiving layer by treatment with a lithographic finisher, said lithographic finisher including a hydrophobizing agent, a surface-active agent and a hydrophilic film-forming compound.

Up until now a mono-sheet DTR offset printing plate of the second type was obtained by processing an imaging element as described above in three, preferably four steps. Said three, preferably four processing steps were (i) a development step during which also the silver diffusion transfer occurs, (ii) a washing rinsing step during which the removal of the layers overlying the image receiving layer is started, (iii) an optional rinsing step during which the removal of the layers overlying the image receiving layer is completed and (iv) a finishing step in order to enhance the water-receptivity of the non-image areas and to make the image areas oleophilic ink-receptive. For the different steps three different chemistries were used: for the first step a developing or activating solution, for the washing step tap water and for the optional rinsing step and for the finishing step a lithographic phinisher, preferably an identical lithographic finisher, more preferably the same lithographic finisher. According to the present invention the tap water for the rinsing step is replaced by a lithographic finisher, preferably by an identical lithographic finisher as used in the finishing step, more preferably said identical lithographic finishers are fed from the same vessel. Ways of feeding the identical lithographic finisher to two (the washing and the finishing step) or to three (the washing, the rinsing and the finishing step) steps are public knowledge, e.g. by the use of a cascade system that first fills a first tank used for the finishing step, thereafter fills a second thank used for the rinsing step by an overflow from the first tank to the second thank and finally fills a third thank used for the washing step by an overflow from the second tank to the third tank. In that case only two chemistries are required: for the first step the above mentioned developing or activating solution and for the following two or three steps the same finishing solution.

A lithographic finisher according to the invention includes a hydrophilic film-forming compound. The hydrophilic film-forming compound has to be chosen from the group of film-forming polymers that are soluble in aqueous medium and thus soften and swell by absorption of water.

Preferably a non-proteinic hydrophilic film-forming compound is used e.g. polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, pullulan, dextrins or derivates thereof, starch, gum arabic, and alginic acid derivatives such as salts and esters thereof. It is also possible to use mixtures of two or more different non-proteinic hydrophilic film-forming polymers. Very preferred compounds are polyvinyl alcohol, dextan or maltodextrin (a hydrolysis product of starch, sold under the trade name GLUCIDEX by Roquette, France) more preferably for at least 50% by weight most preferably for at least 80% by weight of said non-proteinic hydrophilic film-forming binder.

The weight average molecular weight of said hydrophilic film-forming compounds in accordance with the invention ranges preferably between 10.000 and 1.000.000, more preferably between 10.000 and 100.000.

Preferably said hydrophilic film-forming compound is present in the lithographic finisher in an amount from 10 to 200 g/l, more preferably in an amount from 15 to 120 g/l.

The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl containing at least 4 carbon atoms. The hydrophobizing agents can be used alone or in combination with each other.

Preferred hydrophobizing agents are mercapto-1,3,4-thiadiazoles as described in DE-A 1,228,927 and in U.S. Pat. No. 4,563,410, 2-mercapto-1,3,4 oxadiazoles and long chain (at least 4 carbon atoms) alkyl substituted mercaptotetrazoles. Particularly preferred compounds correspond to one of the following formulas:

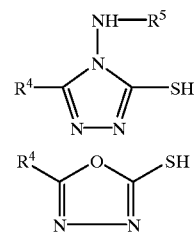

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) are comprised in the lithographic finisher in a total concentration between 0.1 g/l and 10 g/l, preferably in a total concentration between 0.3 g/l and 3 g/l, most preferably in a total concentration between 0.4 g/l and 0.8 g/l.

Suitable surface-active agents for use in the present invention include non-ionic agents such as saponins, polyethylene glycol alkyl ethers or polyethylene glycol alkylaryl ethers, polyethylene glycol esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; empholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferred surface-active compound are anionic or non-ionic surface-active compound such as AKYPO-OP-80 (trade mark for a surfactant sold by CHEMISCHE FABRIK CHEM-Y, Gmbh, Germany with as formula $[C-(CH_3)_3-CH_2-C(CH_3)_2-p.-C_6H_4-(CH_2-CH_2-O)_{14-18}-CH_2-COOH]$, TERGO (trade mark for a surfactant sold by CHEMISCHE FABRIK CHEM-Y, Gmbh, Germany with as formula $[(C_2H_5)(C_4H_9)CH-C_2H_4-(C_4H_9)CH-OSO_3Na]$, FLUORAD FC 126 (trade mark for a surfactant sold by 3M, USA, with as formula $[n.C_7F_{15}CO_2NH_4]$, FT 179 (trade mark for a surfactant sold by BAYER A.G., Germany with as formula $[n.C_8F_{17}SO_2NCH_3CO_2(C_2H_4O)_{19}C_4H_9]$ and AFENA (trade mark for a surfactant sold by RHONE-POULENC S.A., Brussels, Belgium with as formula $[C_9H_{19}-C_6H_4-O-(C_2H_4O)_9H]$.

The concentration of the surface-active compound(s) may vary within broad ranges provided the lithographic finisher shows no excessive degree of foaming when plates are finished. Preferably the surface-active compound(s) is(are) present in the lithographic finisher in an amount between 10 mg/l and 10 g/l, more preferably in an amount between 50 mg/l and 5 g/l, most preferably in an amount between 100 mg/l and 2.5 g/l.

A lithographic finisher in accordance with the invention preferably contains (a) polyglycol(s) or (a) carbohydrate(s).

A polyglycol is a reaction product of water with ethyleneoxide. This reaction product as such is not unambiguous but is a mixture of substances, slightly differing in chemical structure and molecular weight, which mixture can be separated in pure compounds only for the low molecular derivatives (M.W +/−400). When a polyglycol contains ethyleneoxide groups and also propyleneoxide groups the polyglycol group can be a block copolymer group, containing one polyethyleneoxide chain and one polypropyleneoxide chain or a copolymer group, containing the ethyleneoxide groups and propyleneoxide groups at random.

Preferably, when said polyglycols comprise ethyleneoxide groups and propyleneoxide groups, the number ratio between these groups is preferably at least 1, more preferably at least 2, still more preferably at least 3.

Preferably the weight average molecular weight of said polyglycol(s) or carbohydrate(s) is not higher than 1000, more preferably not higher than 500. Most preferred are polyethyleneoxide with a molecular weight of 200 or 300 or a mono- or disaccharide e.g. sorbitol with a molecular weight of 200.

Said polyglycol or carbohydrate according to the invention is used in an amount between 5 and 250 g/l, more preferably between 15 and 125 g/l, most preferably between 25 and 100 g/l.

The lithographic finishers according to the invention preferably have a pH between 4 and 8 and more preferably between 5 and 7. Bufferred lithographic finishers comprising a mixture of sodium dihydrogen orthophosphate and disodium hydrogen orthophosphate and/or a mixture of citric acid and sodium citrate having a pH in said range are preferred.

The lithographic finishers may comprise still other ingredients such as calcium-sequestering compounds, anti-sludge agents and biocides such as 5-bromo-5-nitro-1,3-dioxane, 3-methyl-4—Chloro-phenol, o-phenyl-phenol, p-phenylphenol etc. Preferably, said biocides are used in a concentration between 0.01 g/l and 1 g/l, more preferably between 0.05 g/l and 0.3 g/l.

The imaging element is preferably prepared by coating the different layers on a hydrophilic surface of a support. Alternatively the different layers may be laminated to said image receiving layer from a temporary base holding the layers in reverse order as disclosed in U.S. Pat. No. 5,068,165.

The hydrophilic surface of a support can be a hardened hydrophilic layer, containing a hydrophilic synthetic homopolymer or copolymer and being hardened with a hydrolyzed tetraalkyl orthosilicate crosslinking agent coated on a flexible hydrophobic base. More preferably the hydrophilic layer is part of an aluminum support.

The aluminum support of the imaging element used according to the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminum surface can be carried out mechanically or electrolytically in any known way. The roughness produced by the graining is measured as a centre line average value expressed in $\mu$m and preferably varies from about 0.2 to about 1.5 $\mu$m.

The anodization of the aluminum foil can he performed in electrolytes such as e.g. chromic acid, oxalic acid, sodium carbonate, sodium hydroxide, and mixtures thereof. Preferably, the anodization of the aluminum is performed in dilute aqueous sulphuric acid medium until the desired thickness of the anodization layer is reached. The aluminum foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 um.

After the anodizing step the anodic surface may be sealed. Sealing of the pores of the aluminum oxide layer formed by anodization is a technique known to those skilled in the art of aluminum anodization. The anodic surface of the aluminum foil can thus be rinsed with water at 70–100° C. or with steam. The sealing can also be performed by treatment of the anodic surface with an aqueous solution comprising phosphate ions or silicates. Preferably the sealing is performed by means of an aqueous solution containing a bicarbonate as disclosed in EP-A 567,178. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminum foil can be performed as described in e.g. US-A-3,861,917 and in the documents referred to therein.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic surface of a support as described above the hydrophilic surface of a support may be immediately coated with a solution containing the physical development nuclei or may be coated with said solution at a later stage.

The image receiving layer for use in accordance with the present invention is preferably free of hydrophilic binder but may comprise small amounts up to 80% by weight of the total weight of said layer of a hydrophilic colloid e.g. polyvinyl alcohol or polyvinyl acrylic acid to improve the hydrophilicity of the layer.

Suitable development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

To promote the image sharpness the hydrophilic surface of a support can be provided with a very thin antihalation coating of a dye or pigment or the image receiving layer may incorporate at least one antihalation dye or pigment.

The photosensitive layer used in accordance with the present invention may be any layer comprising a hydrophilic colloid binder and at least one photosensitive silver halide emulsion, being in water permeable relationship with said image receiving layer.

Layers being in water permeable contact with each other are layers that are contiguous to each other or only separated from each other by (a) water permeable layer(s). The nature of a water permeable layer is such that it does not substantially inhibit or restrain the diffusion of water or of compounds contained in an aqueous solution e.g. developing agents or the complexed silver.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 $\mu$m, preferably from 0.25 to 0.45 $\mu$m.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A-493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. No. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part by synthetic, semi-synthetic, or natural polymers. Preferably, the silver halide emulsion layer contains gelatin whereof a 10% by weight aqueous solution at 36° C. and pH 6 has a viscosity lower than 20 mpa.s at a shearing rate of 1000 $s^{-1}$, measured with a viscosimeter operating with a rotating cylinder and marketed under the tradename HAAKE ROTOVISCO rheometer Type M 10, wherein the cylinder can be rotated at 1000 rpm and a maximal shearing rate of 44,500 s$^{-1}$. Said low viscosity gelatin is preferably combined with a gelatin of a higher viscosity. The weight ratio of said low viscosity gelatin versus the gelatin of a higher viscosity is preferably more than 0.5.

Preferably the gelatin layer(s) is(are) substantially unhardened. Substantially unhardened means that when such gelatin layer is coated on a subbed polyethylene terephzalate film base at a dry thickness of 1.2 g/m$^2$, dried for 3 days at 57 C° and 35% R.H. and dipped in water of 30 C°, said gelatin layer is dissolved for more than 95% by weight within 5 minutes.

The silver halide emulsions may contain pH controlling ingredients. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

Preferably, the imaging element also comprises an intermediate layer between the image receiving layer on the hydrophilic surface of the support and the photosensitive layer(packet) to facilate the removal of said layer(packet) thereby uncovering the silver image formed in the image receiving layer by processing the imaging element.

In one embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

In another embodiment, the intermediate layer is a layer comprising particles of a water insoluble inorganic compound having a number average size not lower than 0.1 μm. Preferably, said intermediate layer comprises said water insoluble inorganic compound in an amount of at least 0.1 g/m$^2$. Further details are disclosed in EP-A-723195.

In still another embodiment, the intermediate layer is a layer comprising particles of an alkali insoluble non-polymeric organic compound having a melting point of at least 50° C., said particles having a number average size between 0.1 μm and 10 μm. Preferably, said intermediate layer comprises said alkali insoluble non-polymeric organic compound in an amount of at least 0.1 g/m$^2$. Further details are disclosed in EP-A-95201713.5.

In still another embodiment, the intermediate layer is a layer comprising particles of an alkali insoluble polymeric organic compound obtainable by polycondensation, said particles having a number average size between 0.02 μm and 10 μm. Preferably, said intermediate layer comprises said alkali insoluble polymeric organic compound obtainable by polycondensation in an amount of at least 0.1 g/m$^2$. Further details are disclosed in EP-A-95203052.6.

In a preferred embodiment, the intermediate layer is a water-swellable intermediate layer coated at a ratio of 0.01 to 2.0 g/m$^2$ and comprising at least one non-proteinic hydrophilic film-forming polymer e.g. polyvinyl alcohol or pullulan and optionally comprising an antihalation dye or pigment as disclosed in EP-A-410500.

A supplemental intermediate layer, which may be present between said silver halide emulsion containing layer and said intermediate layer may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the intermediate layer being the upper layer.

Preferably the imaging element comprises an antistress composition on top of the emulsion layer.

The antistress composition according to the invention comprises preferably unhardened gelatin in an amount ranging from 0.60 to 1.75 g/m$^2$, more preferably in an amount ranging from 0.80 to 1.25 g/m$^2$.

Preferably at least 50%, more preferably at least 75%, most preferably at least 90% by weight of said unhardened gelatin belongs to one or more gelatin species whereof a 10% by weight aqueous solution at 40° C. and pH 6 has a viscosity lower than 20 mpas, more preferably lower than 15 mPas at a shearing rate of 1000 s$^{-1}$.

The antistress composition can comprises more than one species of unhardened gelatin whereof a 10% by weight aqueous solution at 40° C. and pH 6 has a viscosity lower than 20 mPas at a shearing rate of 1000 s$^{-1}$, but it is preferred for practical reasons that said composition comprises only one such gelatin. When a mixture of unhardened gelatins is used, a 10% by weight aqueous solution of said mixture of unhardened gelatins has at 40° C. and pH 6 preferably a viscosity lower than 20 mPas at a shearing rate of 1000 s$^{-1}$.

The antistress composition may contain small particles e.g. matting agents with a mean diameter between 0.2 and 10 μm in order to improve the diffusion of processing solutions through said antistress composition.

The antistress composition can comprise more than one layer, but for practical reasons it is preferred that said composition consist of one layer.

The antistress layer according to the invention has to be in water permeable relationship with said image receiving layer in the imaging element.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of at least one developing agent and at least one silver halide solvent said alkaline solution preferably comprising a silver halide solvent.

The developing agent(s) and/or the silver halide solvent(s) can be incorporated in the aqueous alkaline solution and/or in the imaging element itself e.g. in at least one silver halide emulsion layer and/or in a water-swellable layer and/or in a supplemental hydrophilic colloid layer in water-permeable relationship with the silver halide emulsion layer(s).

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Suitable developing agents for use in accordance with the present invention are a hydroquinone-type compound in combination with a secondary developing agent of the class of 1-phenyl-3-pyrazolidone compounds and p-N-methyl-aminophenol. Particularly useful 1-phenyl-3-pyrazolidone developing agents are 1-phenyl-3-pyrazolidone, 1-phenyl-4-methyl-3-pyrazolidone, 1-phenyl-4-ethyl-5-methyl-3-pyrazolidone, and 1-phenyl-4,4-dimethyl-3-pyrazolidone.

The hydroquinone-type compound is e.g. hydroquinone, methyl-hydroquinone, or chlorohydroquinone. Preferred amounts of the hydroquinone-type developing agents are in the range of 0.05 mole to 0.25 mole per litre and preferred amounts of secondary developing agent(s) in the range of $1.8 \times 10^{-3}$ to $2.0 \times 10^{-2}$ mole per litre.

The silver halide solvent, which acts as a complexing agent for silver halide, preferably is a water-soluble thiosulphate or thiocyanate e.g. sodium, potassium, or ammonium thiosulphate or thiocyanate in an amount ranging from 5 g to 20 g per liter.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

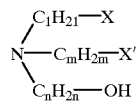

wherein X and X' independently represent hydrogen, a hydroxyl group or an amino group, l and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

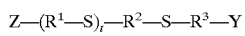

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10. Examples of thioether compounds corresponding to the above formula are disclosed in e.g. U.S. Pat. No. 4,960,683 and EP-A 554,585.

Still further suitable silver halide solverts are 1,2,4-triazolium-3-thiolates, preferably 1,2,4-triazohium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc. Suitable organic alkaline substances are e.g. alkanolamines. In the latter case the alkanolamines will provide or help providing the pH and serve as a silver halide complexing agent.

The aqueous alkaline solution may further comprise hydrophobizing agents such as those described herein before for improving the hydrophobicity of the silver image obtained in the image receiving layer. The hydrophobizing agents can be used alone or in combination with each other.

These hydrophobizing compounds can be added to the aqueous alkaline solution in an amount of preferably 0.1 to 3 g per litre and preferably in admixture with 1-phenyl-5-mercaptotetrazole, the latter compound may be used in amounts of e.g. 50 mg to 1.2 g per litre of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the hydrophilic base an excess of alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to the present invention the silver image in the layer of physical development nuclei is uncovered in EL washing step by washing off all the layers above the layer containing physical development nuclei with a first lithographic finisher.

The temperature of the first lithographic finisher may be varied widely but is preferably between 30° C. and 50° C., more preferably between 35° C. and 45° C.

Often, in order to complete the removal of the layers above the layer containing physical development nuclei it is advisable to rinse the exposed and developed imaging element in a rinsing step with an intermediate lithographic finisher, which serve as a rinsing liquid.

The temperature of the lithographic finisher in this step may be varied widely but is preferably between 30° C. and 60° C., more preferably between 40° C. and 50° C. Usually, the rinsing step does not take long, generally between 5 and 10 seconds.

According to the present invention said exposed, developed, washed and optionally rinsed imaged surface of the hydrophilic support is treated with a second lithographic finisher as described above in order to enhance the water-receptivity of the non-image areas and to make the image areas oleophilic ink-receptive.

At the moment the treatment with the second lithographic finisher is started the exposed imaged surface of the support may be in dry or in wet state. In general, the treatment with the second lithographic finisher does not take long, usually not longer than about 30 seconds. It may be carried out immediately after the processing and uncovering steps or at a later stage, but before the plate is used for printing.

Most second lithographic finishers are used at a temperature between 40 and 50° C. The second lithographic finisher according to the invention can however be used in a temperature range between 20 and 60° C., preferably in a temperature range between 25 and 50° C.

The second lithographic finisher can be applied in different ways such as by rubbing with a roller, by wiping with an absorbent means e.g. with a plug of cotton or sponge, or by dipping the material to be treated in the lithographic finisher. Preferably, the second lithographic finisher is applied automatically by conducting the printing plate through a device having a narrow channel filled with the second lithographic finisher, usually conveying the printing plate at the end of the channel between two squeezing rollers removing the excess of liquid.

Preferably the intermediate and second lithographic finisher are identical, more preferably fed from the same vessel. Still more preferably the first, the optional intermediate and the second lithographic finisher are identical, most preferably fed from the same vessel.

As soon as the hydrophilic surface of the support carrying the silver image has been treated with the second lithographic finisher, it is ready to be used as a printing plate. As said before the first lithographic finisher and the second lithographic finisher are preferably identical.

The invention will now be illustrated by way of the following example without however the intention to limit the invention thereto. All parts are by weight unless otherwise specified.

EXAMPLE 1

A 0,30 mm thick aluminum foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0,6 $\mu$m. The aluminum plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m$^2$ of $Al_2O_3.H_2O$, treated with an aqueous solution containing 20. g/l of $NaHCO_3$ at 45° C. for 30 sec and then rinsed with demineralized water and dried.

The imaging element was obtained by coating the grained, anodized and sealed aluminum support with a silver-receptive stratum containing 2.3 mg/m$^2$ Ag-nuclei as physical development nuclei.

An intermediate layer was then provided on the dry silver-receptive stratum from an aqueous composition in such a way that the resulting dried layer had a weight of 0.1 g/m$^2$ of pullulan and 0.2 g/m$^2$ of Levanyl Rot dispersion (a dispersion of a red pigment marketed by Bayer A.G., Germany).

Subsequently a substantially unhardened photosensitive negative-working cadmium-free gelatin silver chloroiodide emulsion layer (99.75/0.25 mol %) containing 1 mmole/mole AgX of 4-hydroxy-6-methyl-1,3,3a,7-tetraazaindene and 2.2 mole/mole AgX of 1-(3-(2-sulphobenzamido)) phenyl-5-mercapto-tetrazole was coated on the intermediate layer, the silver halide being provided in an amount corresponding to 2.40 g of silver nitrate per m$^2$ and the gelatin content of the emulsion layer being 1.58 g/m$^2$, consisting of 0.7 g/m2 of a gelatin with a viscosity of 21 mPas and the remainder of a gelatin with a viscosity of 14 mpas.

Finally the photosensitive emulsion layer was overcoated with an antistress layer containing no hardeners comprising 0.7 g/m$^2$ gelatin with a viscosity of 10–12 mPas (gelatin K 7598 of Koepff), 0.1 g/m$^2$ of Levanyl Rot dispersion and 0.12 g/m$^2$ of a matting agent with an average equivalent diameter of 7.5 $\mu$m.

The imaging elements were exposed through a contact screen in a process-camera and immersed for 10 s at 24° C.

in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 25 g |
| 1-phenyl-4-methyl-3-pyrazolidone | 6 g |
| potassium bromide | 0.20 g |
| anhydrous sodium thiosulphate | 6 g |
| Potassium alumn | 2 g |
| demineralized water to make | 1000 ml |
| pH (24° C.) = 13 | |

The initiated diffusion transfer was allowed to continue for 30 s to form a silver image in the image receiving layer.

50 m² of plates of the developed monosheet DTR material A was then washed for 6 s with a jet, fed by a tank containing 10 l of tap water at 40° C. in order to remove the antistress layer, the developed silver halide emulsion layer and the intermediate layer from the aluminum foil.

50 m² of plates of the developed monosheet DTR material B was washed for 6 s with a jet, fed by a tank containing 10 l of lithographic finisher M at 40° C. in order to remove the antistress layer, the developed silver halide emulsion layer and the intermediate layer from the aluminum foil.

Next, the imaged surfaces of the developed monosheet DTR materials A and B were guided for 7 s through the lithographic finishers M having a temperature of 45° C. in a rinsing step to complete the removal of the antistress layer, the developed silver halide emulsion layer and the intermediate layer from the aluminum foil.

Finally, the imaged surfaces of the developed monosheet DTR materials A and B were guided for 15 s through the lithographic finisher M having a temperature of 45° C. in a finishing step in order to enhance the water-receptivity of the non-image areas and to make the image areas oleophilic ink-receptive. in this way, two printing plates were prepared. The lithographic finisher M had the following composition:

| | |
|---|---|
| AKYPO-OP-80 (trade mark for a surfactant sold by Chemische Fabrik Chem-Y, Gmbh, Germany) | 300 mg |
| dextran 70000 | 40 g |
| NaH$_2$PO$_4$.2H$_2$O | 20.0 g |
| potassium nitrate | 13.0 g |
| citric acid | 22.0 g |
| 2-mercapto-5-n.heptyl-oxa-3,4-diazole | 0.5 g |
| sodium hydroxide | 12 g |
| 5-bromo-5-nitro-1,3-dioxane | 100 mg |
| polyethylene glycol 200 | 50 ml |
| water to make | 1000 ml |
| pH (20° C.) = 6 | |

The lithographic finisher M used in the rinsing step and in the finishing step are fed from the same vessel.

It is clear from this example that for the preparation of the printing plate A a processor with a connection to the plumbing is required; this is not the case for the preparation of the printing plate B. Furthermore the developed monosheet DTR materials A showed an upstart phenomenom (the first 5 m² of plates had a bronzed outlook and showed spot blinding by printing) and were not completely clean were the developed monosheet DTR materials D did not show an upstart phenomenom and were completely clean. Still further the foam height at equilibrium in the first rinsing zone by using tap water is 280 mm, where said foam height at equilibrium in the first rinsing zone by using lithographic finisher M was 110 mm.

What is claimed:

1. A method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer, applying an aqueous alkaline solution to the imaging element in the presence of (a) developing agent(s) and (a) silver halide solvent(s) to form a silver image in said image receiving layer, treating in a washing step the imaging element with a first lithographic finisher in order to remove the layer(s) on top of the image receiving layer, t hereby exposing the imaged surface of the support by uncovering said silver image formed in said image receiving layer, treating in a finishing step said exposed imaged surface of the support with a second lithographic finisher in order to enhance the water-receptivity of the non-image areas and to make the image areas oleophilic ink-receptive, characterized in that both lithographic finishers include a hydrophobizing agent, a surface-active agent and a hydrophilic film-forming compound and wherein both lithographic finishers are identical.

2. A method for making an offset printing plate according to claim 1 wherein said lithographic finishers include at least one compound selected from the group consisting of polyglycols and carbohydrates.

3. A method for making an offset printing plate according to claim 1 or 2 wherein said hydrophilic film-forming compound is a non-proteinic hydrophilic film-forming binder with a weight average molecular weight between 10.000 and 1.000.000.

4. A method for making an offset printing plate according to claim 3 wherein said non-proteinic hydrophilic film-forming compound is a compound selected from the group consisting of polyvinyl alcohol, dextran and maltodextrin.

5. A method for making an offset printing plate according to claim 1 wherein said hydrophilic film-forming compound is present in said lithographic finisher in an amount from 10 to 200 g/l.

6. A method for making an offset printing plate according to claim 2 wherein the weight average molecular weight of said compound selected from the group consisting of polyglycols and carbohydrates is not higher than 1000.

7. A method for making an offset printing plate according to claim 6 wherein the weight average molecular weight of said compound selected from the group consisting of polyglycols and carbohydrates is not higher than 500.

8. A method for making an offset printing plate according to claim 2 wherein said compound selected from the group consisting of polyglycols and carbohydrates is present in said lithographic finisher in an amount between 5 and 250 g/l.

9. A method for making an offset printing plate according to claim 2 wherein said compound selected from the group consisting of polyglycols and carbohydrates is a compound selected from the group consisting of polyethyleneoxide with a molecular weight of 200, polyethyleneoxide with a molecular weight of 300 and sorbitol with a molecular weight of 200.

10. A method for making an offset printing plate according to claim 1 wherein both lithographic finishers are fed from the same vessel.

11. A method for making an offset printing plate according to claim 1 wherein between said washing step and said finishing step a rinsing step is included comprising treating the exposed, developed and washed imaging element with an intermediate lithographic finisher, comprising a hydrophobizing agent, a surface-active agent and a hydrophilic film-forming compound.

12. A method for making an offset printing plate according to claim 11 wherein said first lithographic finisher, said second lithographic finisher and said intermediate finisher are fed from same vessel.

* * * * *